(12) United States Patent
Wang

(10) Patent No.: US 9,034,739 B2
(45) Date of Patent: May 19, 2015

(54) SEMICONDUCTOR DEVICES AND FABRICATION METHODS

(75) Inventor: Tao Wang, Sheffield (GB)

(73) Assignee: Seren Photonics Limited, Bridgend (GB)

( * ) Notice: Subject to any disclaimer, the term of this patent is extended or adjusted under 35 U.S.C. 154(b) by 0 days.

(21) Appl. No.: 14/002,826

(22) PCT Filed: Feb. 29, 2012

(86) PCT No.: PCT/GB2012/050458
§ 371 (c)(1),
(2), (4) Date: Nov. 5, 2013

(87) PCT Pub. No.: WO2012/117247
PCT Pub. Date: Sep. 7, 2012

(65) Prior Publication Data
US 2014/0299968 A1    Oct. 9, 2014

(30) Foreign Application Priority Data
Mar. 3, 2011    (GB) .................................. 1103657.1

(51) Int. Cl.
*H01L 21/20* (2006.01)
*H01L 21/02* (2006.01)
(Continued)

(52) U.S. Cl.
CPC ...... *H01L 21/02378* (2013.01); *H01L 21/0237* (2013.01); *H01L 21/02439* (2013.01); *H01L 21/02458* (2013.01); *H01L 21/0254* (2013.01); *H01L 21/02603* (2013.01); *H01L 21/02639* (2013.01); *H01L 21/02642* (2013.01); *H01L 21/02647* (2013.01); *H01L 33/007* (2013.01);
(Continued)

(58) Field of Classification Search
CPC .................... H01L 21/0254; H01L 21/02603; H01L 21/02378
USPC ............. 438/46, 77, 483, 492, 493, 500, 503, 438/507, 590; 257/70, 615
See application file for complete search history.

(56) References Cited

U.S. PATENT DOCUMENTS 6,153,010 A    11/2000  Kiyoku et al.
8,790,462 B2 *  7/2014  Samuelson et al. ............. 117/89
(Continued)

FOREIGN PATENT DOCUMENTS

EP    1768196 A2    3/2007
EP    1798780 A2    6/2007
(Continued)

OTHER PUBLICATIONS

Shih-Chun Ling et al., "Crystal Quality Improvement of a-plane GaN Using Epitaxial Lateral Overgrowth on Nanorods," Journal of Crystal Growth, 2010, vol. 312, pp. 1316-1320.

*Primary Examiner* — Hsien Ming Lee
(74) *Attorney, Agent, or Firm* — Fraser Clemens Martin & Miller LLC; William J. Clemens

(57) ABSTRACT

A method of making a semiconductor device comprises: providing a semiconductor wafer having a semiconductor layer; forming a first mask layer over the semiconductor layer; forming a second mask layer over the first mask layer; annealing the second mask layer to form islands; etching through the first mask layer and the semiconductor layer using the islands as a mask to form an array of pillars; and growing semiconductor material between the pillars and then over the tops of the pillars.

16 Claims, 3 Drawing Sheets

(51) Int. Cl.
 *H01L 33/00* (2010.01)
 *H01L 29/06* (2006.01)
 *H01L 29/20* (2006.01)
 *H01L 33/32* (2010.01)
 *H01L 33/18* (2010.01)

(52) U.S. Cl.
 CPC ........... *H01L 33/18* (2013.01); *H01L 21/02381* (2013.01); *H01L 21/02422* (2013.01); *H01L 29/0657* (2013.01); *H01L 29/2003* (2013.01); *H01L 33/32* (2013.01)

(56) References Cited

U.S. PATENT DOCUMENTS

| 2003/0092230 | A1 | 5/2003 | Koike et al. |
| 2004/0029365 | A1 | 2/2004 | Linthicum et al. |
| 2005/0186764 | A1 | 8/2005 | Wu et al. |
| 2009/0079034 | A1 | 3/2009 | Wang |

FOREIGN PATENT DOCUMENTS

| GB | 2470097 | A | 11/2010 |
| KR | 100643473 | B1 | 10/2006 |
| TW | I278908 | B | 4/2007 |

\* cited by examiner

SEMICONDUCTOR DEVICES AND FABRICATION METHODS

The invention relates to semiconductor devices and methods of making semiconductor devices. In particular the invention relates to the production of semiconductor devices with high quality crystal structure. The devices can be used, for example, in the formation of light emitting diodes and solid state lasers.

Currently, there are three main approaches for the fabrication of white light emitting diodes (LEDs) needed for solid state lighting: (1) a package of three LED chips each emitting at a different wavelength (red, green and blue, respectively); (2) a combination of a blue (460 nm) LED and a yellow phosphor pumped by blue light from the LED; (3) a single chip emitting UV light which is absorbed in the LED package by three phosphors (red, green and blue) and reemitted as a broad spectrum of white light. For the 1st and 2nd approaches, the key components are blue/green LEDs, both of which are based on InGaN material systems. For the $3^{rd}$ approach, ultraviolet (UV) emitters with high performance are required.

Advanced growth technologies for InGaN based and AlGaN-based devices have been well established, but are generally based on c-face sapphire substrates. This polar orientation results in intense built-in electric field due to piezoelectric effects and the devices suffer from reduced overlap between the electron and hole wave functions and long radiative recombination times, and thus low quantum efficiency. This is the so-called quantum confined Stark effect (QCSE). In particular, when the emitters move towards the green spectral region, much higher InN fractions are required and the internal electric fields generally become extremely high. This presents a major obstacle to achieving InGaN-based emitters (in particular, green emitter) with high performance. The same problem arises for AlGaN-based UV emitters, but it is even worse for AlGaN than for InGaN.

Homoepitaxial growth is ideal for III-nitride based optoelectronic devices. However, due to affordability reasons, growth on foreign substrate such as sapphire, SiC, silicon, etc., still remains a main approach for growth of III-nitrides. Such "large lattice-mismatched heteroepitaxy" leads to a very high density of dislocations. This will cause a significant reduction in optical performance of III-nitride optoelectronics, such as InGaN-based near UV/blue/green emitters and AlGaN/GaN-based UV emitters. The dislocation issue becomes more pronounced in AlGaN/GaN-based UV emitters than InGaN-based emitters, as optical performance of AlGaN/GaN-based UV emitters is more sensitive to dislocations than InGaN-based emitters.

The two issues (QCSE and dislocations) stated above are two fundamental obstacles in further improving optical performance of III-nitride-based optoelectronics.

One of the most promising approaches to counteract the negative effects of the QCSE is growth along non-polar or semi-polar orientations, as confirmed theoretically and experimentally. Another major advantage of non-polar or semi-polar III-nitride emitters is that they can emit polarized light. Liquid-crystal displays (LCDs) require polarized illumination and current LCDs require an extra polarizing element to achieve this. The low transmission efficiency of the polarizer leads to lower efficiency and a device emitting polarized light is advantageous.

Very recently III-nitride growth on non-polar or semi-polar planes has led to major breakthroughs for green emitters. However, a major challenge has also been exposed, i.e., these non-polar or semi-polar III-nitride emitters with high performance are exclusively grown on extremely expensive GaN substrates, i.e. using the homoepitaxial growth approach. Unfortunately, non-polar or semi-polar GaN substrates are very small and extremely expensive. In addition, being highly non-uniform also makes them unsuitable for mass production.

Therefore, it is desirable to obtain non-polar or semi-polar GaN with high crystal template on sapphire substrate with any size (such as up to 12 inch) for further growth of InGaN-based or AlGaN-based device structures. So far, conventional epitaxial lateral overgrowth (ELOG) has been employed in improving crystal quality of non-polar or semi-polar GaN on sapphire. The ELOG technique is based on selective area growth. Typically, a standard GaN layer is first grown on sapphire by metalorganic vapour phase epitaxy (MOVPE) or molecular beam epitaxy (MBE) or hydride vapour phase epitaxy (HVPE), and the surface is then coated ex-situ with a dielectric mask such as $SiO_2$ or $Si_3N_4$. The mask is then patterned into micron-scale stripes (not nanometer scale) using standard photolithography. The masked sample is then used as a template for further growth by MOVPE or MBE or HVPE. The re-growth starts on the exposed GaN in the mask window areas, as the GaN does not grow on top of the dielectric mask. When the growing face reaches above the height of the mask the GaN regrowth extends laterally over the striped mask, and can eventually coalesces to form a smooth surface. The dislocations in the crystal structure originating under the mask stripes, caused by the large lattice mismatch between sapphire and GaN, are effectively blocked. Due to the limits of standard photolithography, the mask-stripe width and wing width can not be further decreased down to nanometer scale. Therefore, normally, a flat surface cannot be obtained till the overgrown layer has reached more than 10-20 μm thick. In addition, it is difficult to apply such approach in overgrowth of AlGaN, as AlGaN lateral growth rate is generally much smaller than GaN lateral growth rate, leading to a very slow coalescence.

Therefore, the conventional ELOG approach is very complicated, and thus leads to much higher extra cost.

The invention provides method of making a semiconductor device. The method may comprise providing a semiconductor wafer having a semiconductor layer. The method may comprise forming a first mask layer over the semiconductor layer. The method may comprise forming a second mask layer over the first mask layer. The method may comprise annealing or otherwise applying or modifying the second mask layer to form islands. The method may comprise etching through the first mask layer and the semiconductor layer using the islands as a mask to form an array of pillars. The method further comprises growing semiconductor material between the pillars and then over the tops of the pillars.

The method may comprise removing the islands before growing the semiconductor material.

A cap formed from one of the mask layers may be left on the top of each of the pillars during the growing of the semiconductor material. This may be the first mask layer.

The semiconductor layer may be supported on a substrate. The substrate may comprise at least one of sapphire, silicon and silicon carbide.

The semiconductor material which is grown onto the pillars may be the same material as that making up the semiconductor layer (and hence the pillars), or it may be a different material.

The semiconductor layer may be formed of a group III nitride. For example it may be formed of gallium nitride, indium gallium nitride, or aluminium gallium nitride. The semiconductor material may also be a group III nitride material, such as gallium nitride, indium gallium nitride, or aluminium gallium nitride.

The first mask layer may be formed of at least one of silicon dioxide and silicon nitride.

The second mask layer may be formed of a metal, for example nickel.

The method may further comprise removing the support substrate. This may include removing a part, e.g. the lowest part, of the pillars.

The present invention further provides a semiconductor device comprising an array of pillars each including a main column formed of semiconductor material, and each including a cap formed of a mask material formed on its top, and a semiconductor material extending between the pillars and over the top of the pillars, and over the caps, to form a continuous layer. The two semiconductor materials may be the same, or they may be different. The pillar array may comprise pillars all having diameters less than 1000 nm and preferably less than 500 nm, and more preferably less than 300 nm. In some cases there may be irregularity in the diameters such that some of the pillars are large, but preferably at least 90% of the pillars have diameters of the sizes indicated above. The height of the pillars is preferably at least 500 nm, more preferably at least 750 nm. The pillars may be all of substantially the same height. The mask material may be a metal.

At least some of the nano-pillars may have cavities around their bases.

The present invention is based on combination of a so-called self-organised nano-mask approach and then subsequent overgrowth. The fabrication of the self-organised nano-mask is very simple, and does not require extra photolithography. The overgrown layer can be relatively thin compared to known ELOG methods, but the obtained crystal quality is equivalent to or better than that obtained by the conventional ELOG. Therefore, the cost can be significantly reduced. In addition, the approach can be extended for growth of any III-nitrides including polar, non-polar, or semi-polar.

The method or device may further comprise, in any combination, any one or more of the steps or features of the preferred embodiments of the invention, which will now be described, by way of example only, with reference to the accompanying drawings in which.

Figure 1A:
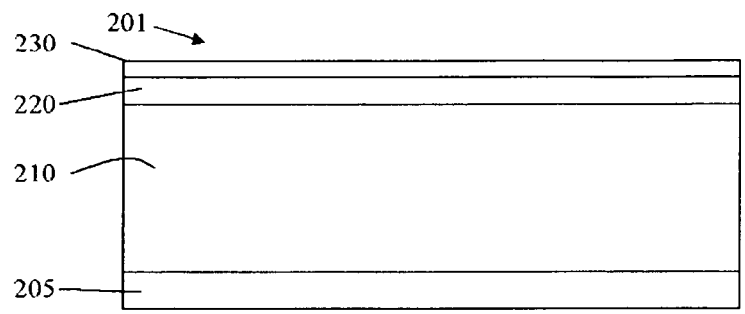
FIGS. 1a to 1h show the steps in the formation of a device according an embodiment of the invention.
Figure 1B:
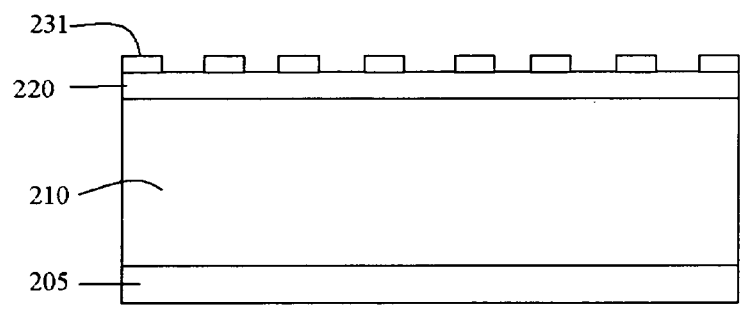

Referring to FIG. 1a, the first step of fabricating the device is providing a suitable semiconductor wafer 201. The wafer 201 is conventional and is made up of a substrate 205, which in this case comprises a layer of sapphire, over which is a semiconductor layer 210 formed of gallium nitride (GaN). Other materials can be used. For example the substrate may be silicon or silicon carbide. The semiconductor may be another suitable material, for example another group III nitride such as indium gallium nitride (InGaN) or aluminium gallium nitride (AlGaN).

A first mask layer 220 is provided over the semiconductor layer 210, for example using plasma-enhanced chemical vapour deposition (PECVD). The first mask layer 220 is formed of silicon dioxide, although there are suitable alternative materials for this layer e.g. silicon nitride, and is deposited at an approximately uniform thickness of 200 nanometers.

A second mask layer 230, comprising a metal which in this case is nickel, is provided over the first mask layer 220. This can be by thermal evaporation or sputtering or electron beam evaporation. In this step, a nickel layer of approximately uniform thickness in the range 5 to 50 nanometers is formed and then annealed under flowing nitrogen ($N_2$), at a temperature in the range 600 to 900 degrees Celsius. The duration of the annealing process is between 1 and 10 minutes, resulting in formation from the nickel layer of a second mask layer 230 comprising self-assembled nickel islands 231 distributed irregularly over the first mask layer 220. Each of the nickel islands covers a respective, approximately circular, area of the upper surface of first mask layer 220 which is, typically, no less than 100 nanometers in diameter and no more than 1000 nanometers in diameter. Thus the second mask layer 230 can act as a mask for etching the underlying $SiO_2$ layer, in which the nickel islands 231 mask areas of the underlying $SiO_2$ layer and the spaces between the nickel islands leave exposed areas of the $SiO_2$ layer, defining which areas of the underlying $SiO_2$ layer will be etched.

Figure 1C:
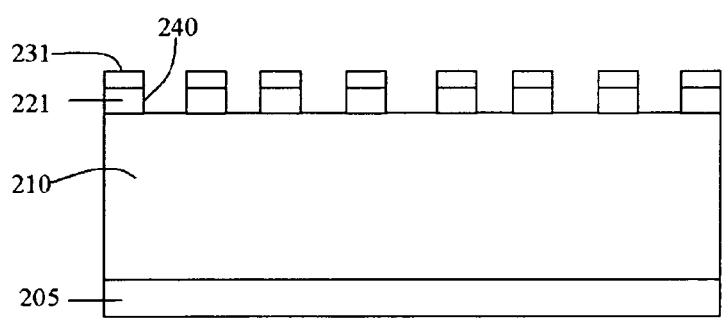

With reference to FIG. 1c, the first mask layer 220 is etched through using $CHF_3$ or $SF_6$ in a reactive ion etching (RIE) process using the metal islands 231 of the second mask layer 230 as a mask. This step provides nano-pillars (also referred to as nano-rods) 240 of silicon dioxide distributed irregularly over the GaN layer 210, each comprising a respective part 221 of the first mask layer 220 and a respective nickel island 231. Each nano-rod 240 corresponds to a respective nickel island, having a diameter that is approximately the same as the diameter of the surface area covered its respective nickel island. The nano-pillars 240 resulting from the previous step serve to mask some areas of the GaN layer 210, and to define which areas (i.e. those exposed areas in the spaces between the nano-pillars 240) of the GaN layer 210 will be etched.

Figure 1D:
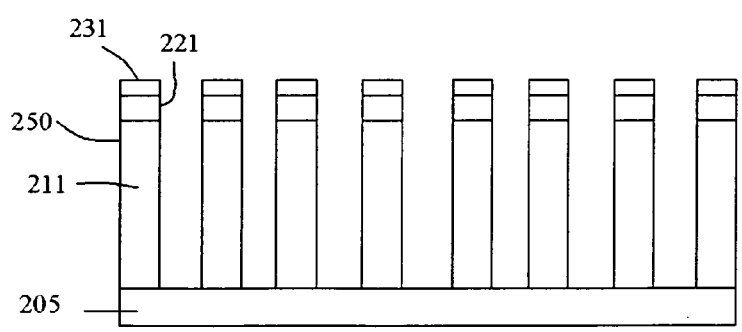

Referring to FIG. 1d, at the next step the GaN layer 210 is etched, for example by inductively coupled plasma etching, with the nano-pillars 240 that were formed in the previous steps used as a mask. This step involves etching though the GaN layer 210, such as shown in FIG. 1d, or partly through the GaN layer 210. This step results in a nano-pillar structure, as shown in FIG. 1d, in which nano-pillars 250 extend upwards from the sapphire substrate 205, each nano-pillar 250 comprising a respective part 211 of the GaN layer 210, a part 221 of the first mask layer 220, and a metal island 231 from the second mask layer 230. Therefore the etching of this step produces exposed surfaces 250a of the GaN, which comprise the sides of the nano-pillars 250. The diameter of each nano-pillar 250 is approximately constant from top to bottom, being approximately the same as the diameter of the surface area covered by its respective nickel island 231, although in practice some tapering of the nano-pillars generally occurs.

Figure 1E:
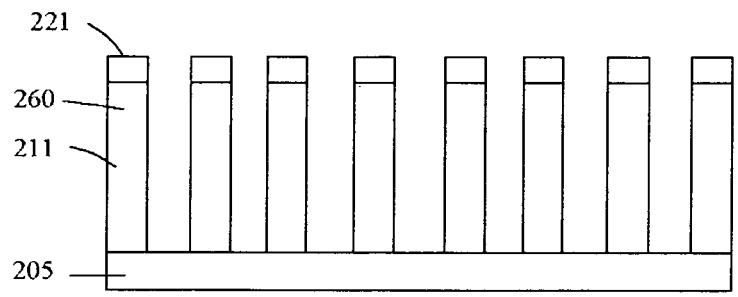

Referring to FIG. 1e, the nickel islands 231 forming the second mask layer 230 are then removed, leading to the nano-pillar 260 comprising a respective part 211 of the GaN layer 210, a part 221 of the first mask layer 220. This can be done by wet etching using hydrochloric acid (HCl) or nitric acid ($HNO_3$). This leaves each nano-pillar comprising mainly a GaN column 211 with a $SiO_2$ cap 221 on its top end.

Figure 1F:
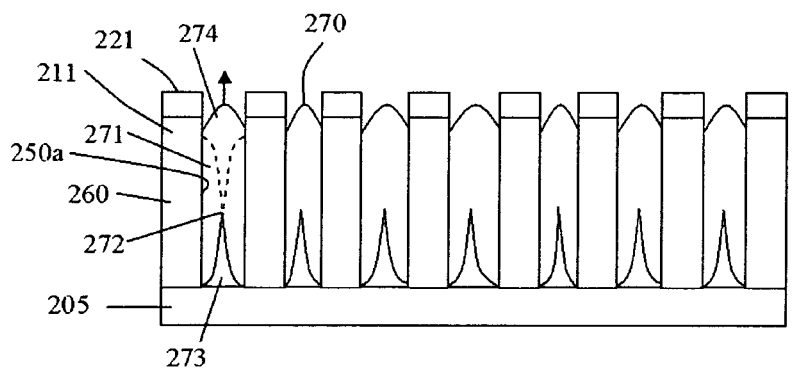
Figure 1G:
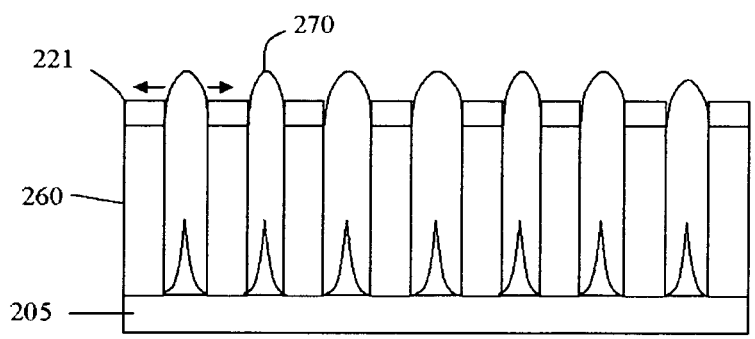
Figure 1H:
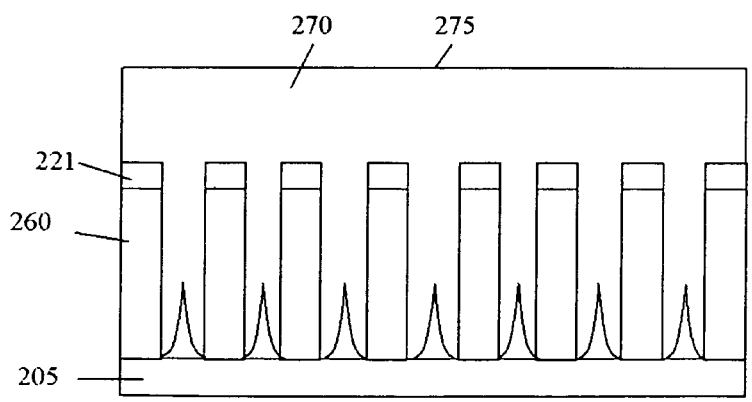

Referring to FIG. 1f, the GaN nano-rod array is used as a template for deposition of GaN 270 onto the sides 250a of the GaN columns 211 by metalorganic chemical vapour deposition (MOCVD) or MBE or HVPE for overgrowth. The re-growth starts on the sidewall of GaN nano-rod (firstly laterally and then vertically), where the GaN is exposed. This forms layers 271 on the sides of the nano-pillars. These grow outwards from the pillars and towards each other until they meet where the layers are thickest. This then prevents further growth in the volume 273 below the meeting point 272, and growth continues in the volume 274 above the meeting point. This leaves, in some cases, the volume 273 as hollow gaps or cavities around the base of each of the nano-pillars. These gaps may be interconnected to form a cavity, which is labyrinthine in form and extends between all, or substantially all of the nano-pillars. The SiO2 masks 221 on the top of nano-pillar will prevent GaN growth on their top. Referring to FIG. 1*g*, when the growing face of the GaN reaches above the height of the SiO2 nano-masks 221 the GaN re-growth progresses laterally over the top of the SiO2 nano-mask, and eventually coalesces to form a continuous layer extending over the top of the nano-mask, and having a smooth surface 275 as shown in FIG. 1*h*. In theory, all the dislocations originating from the template (i.e. in the nano-pillars 260) are effectively blocked. Even if there are no cavities left around the bottom of the nano-pillars, the growth from the bottom of the gaps between the nano-pillars is generally partially or completely cut off by the growth from the sides of the nano-pillars, and the number of dislocations extending up to the top of the nano-pillars will therefore be very low.

Once the growth has been completed, the substrate 205 can be removed. Removal of the substrate will generally include removal of the bottom end of the nano-pillars 260. This can be made easier by the presence of the hollow volume 273 around the base of the nano-pillars. The bases of the nano-pillars 260 may be removed up to a level which is below the meeting point 272. i.e. below the top of the hollow volume 273. This can result in a very uniform structure with low levels of strain.

Figure 2:
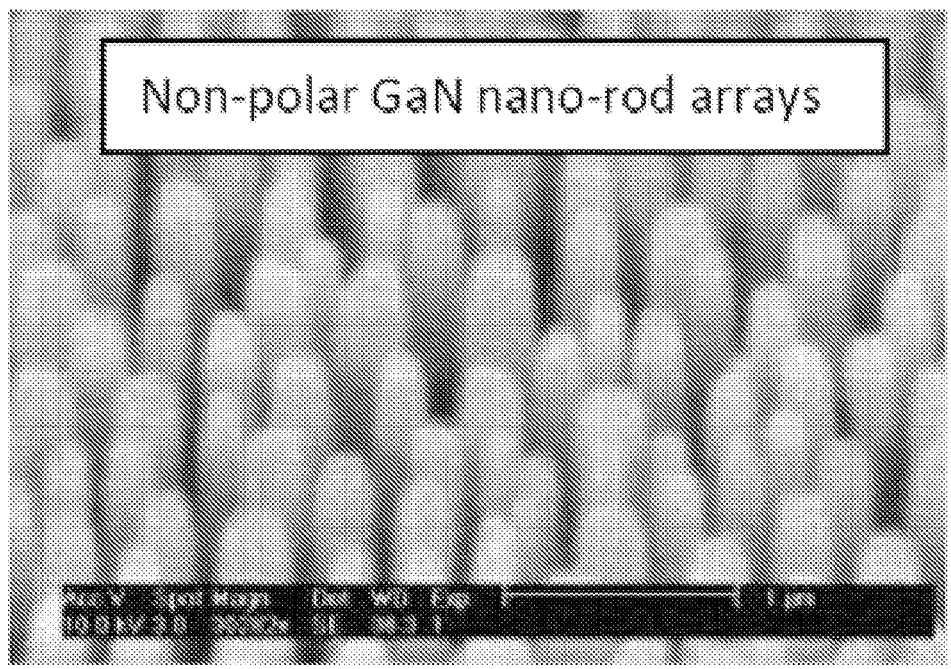
FIG. 2 is an image of a nano-rod array as shown in FIG. 1d.

FIG. 2 shows the resulting high density array of GaN nanorods, each with a diameter of ~200 nm. It is important to note that the side-walls of the GaN nanorods show the desired vertical alignment.

Figure 3:
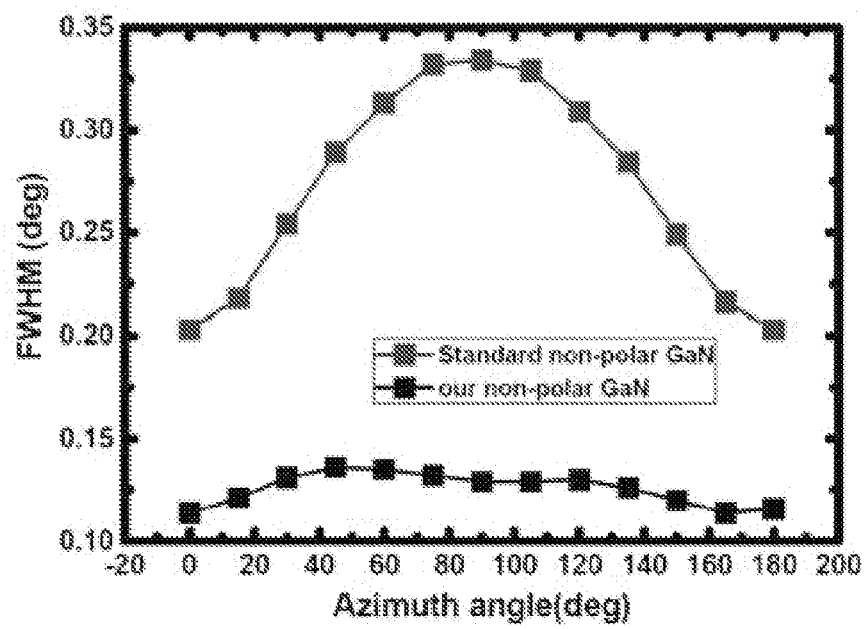
FIG. 3 is a graph showing the full width at half maximum for the x-ray rocking curve as a function of azimuth angle of the incident x-ray beam, for a sample formed according to the method of FIGS. 1a to 1h, and a standard sample of non-polar GaN.

FIG. 3 show the X-ray diffraction results for a sample produced as described above. It can be seen that the full-width at half-maximum of the x-ray rocking curve is massively reduced for all azimuth angles of incident x-ray beam (The zero angle of azimuth angle is defined as the projection of the incident beam is parallel to the c direction of the grown GaN layer) compared with a standard non-polar GaN sample on r-plane sapphire. This indicates that the dislocation density has been massively reduced in this embodiment of the invention.

It is also very effective to extend the approach described above to the overgrowth of AlGaN on a GaN nano-pillar structure, without worrying about the coalescence issue, as the gaps between the GaN nano-rods are on a nano-meter scale, which is much narrower than those in the SiO$_2$ masks generally used in the conventional ELOG mentioned above. In addition, due to the residual voids left in the gaps between nano-rods during the overgrowth, the cracking issue of AlGaN on GaN which generally happens in conventional III-nitride growth can be eliminated.

It will be appreciated that other embodiments of the invention will vary from those described above. The method is applicable to different combinations of substrate, nano-pillar structure material, and grown semiconductor material, but is mostly applicable where the substrate and grown semiconductor have sufficiently different lattice structures for the formation of dislocations in the semiconductor lattice structure to be a problem. Obviously the exact scale of the structure can be varied, though it is a particular advantage of the method that structure can be produced on a small scale.

The invention claimed is:

1. A method of making a semiconductor device comprising:
    (i) providing a semiconductor wafer having a semiconductor layer;
    (ii) forming a first mask layer of at least one of silicon dioxide and silicon nitride over the semiconductor layer;
    (iii) forming a second mask layer of metal over the first mask layer;
    (iv) annealing the second mask layer to form islands;
    (v) etching through the first mask layer and the semiconductor layer using the islands as a mask to form an array of pillars each having a top;
    (vi) removing the islands; and
    (vii) growing semiconductor material between the pillars and then over the tops of the pillars, wherein the first mask layer is left on the top of each of the pillars to form a cap during the growing of the semiconductor material.

2. The method according to claim 1, further comprising providing a substrate wherein the semiconductor layer is supported on the substrate.

3. The method according to claim 2 wherein the substrate comprises at least one of sapphire, silicon and silicon carbide.

4. The method according to claim 1 wherein the semiconductor layer is formed of a group III nitride.

5. The method according to claim 1 wherein the second mask layer is formed of nickel.

6. A method of making a semiconductor device comprising:
    (i) providing a semiconductor wafer having a semiconductor layer;
    (ii) forming a first mask layer over the semiconductor layer;
    (iii) forming a second mask layer over the first mask layer;
    (iv) annealing the second mask layer to form islands;
    (v) etching through the first mask layer and the semiconductor layer using the islands as a mask to form an array of pillars each having a top; and
    (vi) growing a semiconductor material between the pillars and then over the tops of the pillars, wherein each of the pillars has a base, and the growing step leaves gaps around the bases of the pillars.

7. The method according to claim 6 wherein the semiconductor material grown on pairs of the pillars that are adjacent meets at a level spaced from the substrate, so that the gaps are left below that level.

8. A semiconductor device comprising an array of pillars formed of semiconductor material, each having a top and including a cap formed of at least one of silicon dioxide and silicon nitride formed on its top, and a semiconductor material extending between the pillars and over the tops of the pillars to form a continuous layer.

9. The semiconductor device according to claim 8 formed according to the method of claim 1.

10. The semiconductor device according to claim 8 wherein at least 90% of the pillars have a diameter of less than 1000 nm.

11. The semiconductor device according to claim 8 wherein the pillars are at least 500 nm in height.

12. The semiconductor device according to claim 8 further comprising a substrate wherein the semiconductor layer is supported on the substrate.

13. The semiconductor device according to claim 8 wherein the substrate comprises at least one of sapphire, silicon and silicon carbide.

14. The semiconductor device according to claim 8 wherein the semiconductor layer is formed of a group III nitride.

15. The semiconductor device according to claim 8 wherein the second mask layer is formed of nickel.

16. The semiconductor device according to claim 8 wherein each of the pillars has a base, and there are gaps around the bases of the pillars.

* * * * *